(12) United States Patent
Im

(10) Patent No.: US 8,557,040 B2
(45) Date of Patent: Oct. 15, 2013

(54) SYSTEMS AND METHODS FOR PREPARATION OF EPITAXIALLY TEXTURED THICK FILMS

(75) Inventor: James S. Im, New York, NY (US)

(73) Assignee: The Trustees of Columbia University in the City of New York, New York, NY (US)

(*) Notice: Subject to any disclaimer, the term of this patent is extended or adjusted under 35 U.S.C. 154(b) by 877 days.

(21) Appl. No.: 12/275,727

(22) Filed: Nov. 21, 2008

(65) Prior Publication Data

US 2009/0130795 A1    May 21, 2009

Related U.S. Application Data

(60) Provisional application No. 60/989,729, filed on Nov. 21, 2007, provisional application No. 61/012,229, filed on Dec. 7, 2007.

(51) Int. Cl.
```
C30B 1/00      (2006.01)
C30B 3/00      (2006.01)
C30B 5/00      (2006.01)
C30B 28/02     (2006.01)
```
(52) U.S. Cl.
USPC .................. 117/9; 117/4; 117/7; 117/10
(58) Field of Classification Search
USPC .......................... 117/11, 7, 9, 4, 10
See application file for complete search history.

(56) References Cited

U.S. PATENT DOCUMENTS

| | | | |
|---|---|---|---|
| 3,632,205 A | 1/1972 | Marcy | |
| 4,234,358 A | 11/1980 | Celler et al. | |
| 4,309,225 A | 1/1982 | Fan et al. | |
| 4,382,658 A | 5/1983 | Shields et al. | |

(Continued)

FOREIGN PATENT DOCUMENTS

| | | |
|---|---|---|
| CN | 1495848 A | 5/2004 |
| DE | 198 39 718 A1 | 3/2000 |

(Continued)

OTHER PUBLICATIONS

Bergmann, R. et al., Nucleation and Growth of Crystalline Silicon Films on Glass for Solar Cells, Phys. Stat. Sol., 1998, pp. 587-602, vol. 166, Germany.

(Continued)

*Primary Examiner* — James McDonough
(74) *Attorney, Agent, or Firm* — Wilmer Cutler Pickering Hale and Dorr LLP

(57) ABSTRACT

The disclosed subject matter relates to the use of laser crystallization of thin films to create epitaxially textured crystalline thick films. In one or more embodiments, a method for preparing a thick crystalline film includes providing a film for crystallization on a substrate, wherein at least a portion of the substrate is substantially transparent to laser irradiation, said film including a seed layer having a predominant surface crystallographic orientation; and a top layer disposed above the seed layer; irradiating the film from the back side of the substrate using a pulsed laser to melt a first portion of the top layer at an interface with the seed layer while a second portion of the top layer remains solid; and re-solidifying the first portion of the top layer to form a crystalline laser epitaxial with the seed layer thereby releasing heat to melt an adjacent portion of the top layer.

7 Claims, 4 Drawing Sheets

(56) References Cited

U.S. PATENT DOCUMENTS

| | | |
|---|---|---|
| 4,456,371 A | 6/1984 | Lin |
| 4,639,277 A | 1/1987 | Hawkins |
| 4,653,903 A | 3/1987 | Torigoe et al. |
| 4,691,983 A | 9/1987 | Kobayashi et al. |
| 4,727,047 A | 2/1988 | Bozler et al. |
| 4,758,533 A | 7/1988 | Magee et al. |
| 4,793,694 A | 12/1988 | Liu |
| 4,800,179 A | 1/1989 | Mukai et al. |
| 4,855,014 A | 8/1989 | Kakimoto et al. |
| 4,870,031 A | 9/1989 | Sugahara et al. |
| 4,940,505 A | 7/1990 | Schachameyer et al. |
| 4,970,546 A | 11/1990 | Suzuki et al. |
| 4,977,104 A | 12/1990 | Sawada et al. |
| 5,032,233 A | 7/1991 | Yu et al. |
| 5,061,655 A | 10/1991 | Ipposhi et al. |
| 5,076,667 A | 12/1991 | Stewart et al. |
| RE33,836 E | 3/1992 | Resor, III et al. |
| 5,145,808 A | 9/1992 | Sameshima et al. |
| 5,173,441 A | 12/1992 | Yu et al. |
| 5,204,659 A | 4/1993 | Sarma |
| 5,233,207 A | 8/1993 | Anzai et al. |
| 5,247,375 A | 9/1993 | Mochizuki et al. |
| 5,281,840 A | 1/1994 | Sarma |
| 5,285,236 A | 2/1994 | Jain |
| 5,291,240 A | 3/1994 | Jain |
| 5,294,811 A | 3/1994 | Aoyama et al. |
| 5,304,357 A | 4/1994 | Sato et al. |
| 5,338,959 A | 8/1994 | Kim et al. |
| 5,373,803 A | 12/1994 | Noguchi et al. |
| 5,395,481 A | 3/1995 | McCarthy |
| 5,409,867 A | 4/1995 | Asano |
| 5,453,594 A | 9/1995 | Konecny |
| 5,456,763 A | 10/1995 | Kaschmitter et al. |
| 5,496,768 A | 3/1996 | Kudo |
| 5,512,494 A | 4/1996 | Tanabe |
| 5,523,193 A | 6/1996 | Nelson |
| 5,529,951 A | 6/1996 | Noguchi et al. |
| 5,571,430 A | 11/1996 | Kawasaki et al. |
| 5,591,668 A | 1/1997 | Maegawa et al. |
| 5,663,579 A | 9/1997 | Noguchi |
| 5,683,935 A | 11/1997 | Miyamoto et al. |
| 5,710,050 A | 1/1998 | Makita et al. |
| 5,721,606 A | 2/1998 | Jain |
| 5,742,426 A | 4/1998 | York |
| 5,756,364 A | 5/1998 | Tanaka et al. |
| 5,766,989 A | 6/1998 | Maegawa et al. |
| 5,767,003 A | 6/1998 | Noguchi |
| 5,817,548 A | 10/1998 | Noguchi et al. |
| 5,844,588 A | 12/1998 | Anderson |
| 5,858,807 A | 1/1999 | Kawamura |
| 5,861,991 A | 1/1999 | Fork |
| 5,893,990 A | 4/1999 | Tanaka |
| 5,948,172 A | 9/1999 | Neiheisel |
| 5,948,291 A | 9/1999 | Neylan et al. |
| 5,960,323 A | 9/1999 | Wakita et al. |
| 5,986,807 A | 11/1999 | Fork |
| 6,002,523 A | 12/1999 | Tanaka |
| 6,014,944 A | 1/2000 | Aklufi et al. |
| 6,020,224 A | 2/2000 | Shimogaichi et al. |
| 6,020,244 A | 2/2000 | Thompson et al. |
| 6,045,980 A | 4/2000 | Edelkind et al. |
| 6,072,631 A | 6/2000 | Guenther et al. |
| 6,081,381 A | 6/2000 | Shalapenok et al. |
| 6,117,752 A | 9/2000 | Suzuki |
| 6,120,976 A | 9/2000 | Treadwell et al. |
| 6,130,009 A | 10/2000 | Smith et al. |
| 6,130,455 A | 10/2000 | Yoshinouchi et al. |
| 6,135,632 A | 10/2000 | Flint |
| 6,136,632 A | 10/2000 | Higashi |
| 6,156,997 A | 12/2000 | Yamazaki et al. |
| 6,162,711 A | 12/2000 | Ma et al. |
| 6,169,014 B1 | 1/2001 | McCulloch |
| 6,172,820 B1 | 1/2001 | Kuwahara |
| 6,176,922 B1 | 1/2001 | Aklufi et al. |
| 6,177,301 B1 | 1/2001 | Jung |
| 6,184,490 B1 | 2/2001 | Schweizer |
| 6,187,088 B1 | 2/2001 | Okumura |
| 6,190,985 B1 | 2/2001 | Buynoski |
| 6,193,796 B1 | 2/2001 | Yang et al. |
| 6,203,952 B1 | 3/2001 | O'Brien et al. |
| 6,235,614 B1 | 5/2001 | Yang et al. |
| 6,242,291 B1 | 6/2001 | Kusumoto et al. |
| 6,274,488 B1 | 8/2001 | Talwar et al. |
| 6,285,001 B1 | 9/2001 | Fleming et al. |
| 6,300,175 B1 | 10/2001 | Moon et al. |
| 6,313,435 B1 | 11/2001 | Shoemaker et al. |
| 6,316,338 B1 | 11/2001 | Jung et al. |
| 6,320,227 B1 | 11/2001 | Lee et al. |
| 6,322,625 B2 | 11/2001 | Im |
| 6,326,186 B1 | 12/2001 | Kirk et al. |
| 6,326,215 B1 | 12/2001 | Keen |
| 6,326,286 B1 | 12/2001 | Park et al. |
| 6,333,232 B1 | 12/2001 | Kunikiyo et al. |
| 6,341,042 B1 | 1/2002 | Matsunaka et al. |
| 6,348,990 B1 | 2/2002 | Igasaki et al. |
| 6,353,218 B1 | 3/2002 | Yamazaki et al. |
| 6,358,784 B1 | 3/2002 | Zhang et al. |
| 6,368,945 B1 | 4/2002 | Im |
| 6,387,178 B1 | 5/2002 | Geho et al. |
| 6,388,146 B1 | 5/2002 | Onishi et al. |
| 6,388,386 B1 | 5/2002 | Kunii et al. |
| 6,392,810 B1 | 5/2002 | Tanaka et al. |
| 6,393,042 B1 | 5/2002 | Tanaka et al. |
| 6,407,012 B1 | 6/2002 | Miyasaka et al. |
| 6,410,373 B1 | 6/2002 | Chang et al. |
| 6,429,100 B2 | 8/2002 | Yoneda et al. |
| 6,432,758 B1 | 8/2002 | Cheng et al. |
| 6,437,284 B1 | 8/2002 | Okamoto et al. |
| 6,444,506 B1 | 9/2002 | Kusumoto et al. |
| 6,445,359 B1 | 9/2002 | Ho |
| 6,448,612 B1 | 9/2002 | Miyazaki et al. |
| 6,451,631 B1 | 9/2002 | Grigoropoulos et al. |
| 6,455,359 B1 | 9/2002 | Yamazaki et al. |
| 6,468,845 B1 | 10/2002 | Nakajima et al. |
| 6,471,772 B1 | 10/2002 | Tanaka et al. |
| 6,472,684 B1 | 10/2002 | Yamazaki et al. |
| 6,476,447 B1 | 11/2002 | Yamazaki et al. |
| 6,479,837 B1 | 11/2002 | Ogawa et al. |
| 6,482,722 B2 | 11/2002 | Kunii et al. |
| 6,493,042 B1 | 12/2002 | Bozdagi et al. |
| 6,495,067 B1 | 12/2002 | Ono et al. |
| 6,495,405 B2 | 12/2002 | Voutsas et al. |
| 6,501,095 B2 | 12/2002 | Yamaguchi et al. |
| 6,504,175 B1 | 1/2003 | Mei et al. |
| 6,506,636 B2 | 1/2003 | Yamazaki et al. |
| 6,511,718 B1 | 1/2003 | Paz de Araujo et al. |
| 6,512,634 B2 | 1/2003 | Tanaka et al. |
| 6,516,009 B1 | 2/2003 | Tanaka et al. |
| 6,521,492 B2 | 2/2003 | Miyasaka et al. |
| 6,526,585 B1 | 3/2003 | Hill |
| 6,528,359 B2 | 3/2003 | Kusumoto et al. |
| 6,531,681 B1 | 3/2003 | Markle et al. |
| 6,535,535 B1 | 3/2003 | Yamazaki et al. |
| 6,555,422 B1 | 4/2003 | Yamazaki et al. |
| 6,555,449 B1 | 4/2003 | Im et al. |
| 6,563,077 B2 | 5/2003 | Im |
| 6,573,163 B2 | 6/2003 | Voutsas et al. |
| 6,573,531 B1 | 6/2003 | Im et al. |
| 6,577,380 B1 | 6/2003 | Sposili et al. |
| 6,582,827 B1 | 6/2003 | Im |
| 6,590,228 B2 | 7/2003 | Voutsas et al. |
| 6,608,326 B1 | 8/2003 | Shinagawa et al. |
| 6,621,044 B2 | 9/2003 | Jain et al. |
| 6,635,554 B1 | 10/2003 | Im et al. |
| 6,635,932 B2 | 10/2003 | Grigoropoulos et al. |
| 6,667,198 B2 | 12/2003 | Shimoto et al. |
| 6,693,258 B2 | 2/2004 | Sugano et al. |
| 6,734,635 B2 | 5/2004 | Kunii et al. |
| 6,741,621 B2 | 5/2004 | Asano |
| 6,750,424 B2 | 6/2004 | Tanaka |
| 6,755,909 B2 | 6/2004 | Jung |
| 6,784,455 B2 | 8/2004 | Maekawa et al. |
| 6,830,993 B1 | 12/2004 | Im et al. |
| 6,858,477 B2 | 2/2005 | Deane et al. |

(56) References Cited

U.S. PATENT DOCUMENTS

| | | |
|---|---|---|
| 6,860,939 B2 | 3/2005 | Hartzell |
| 6,908,835 B2 | 6/2005 | Sposili et al. |
| 6,916,690 B2 | 7/2005 | Chang |
| 6,961,117 B2 | 11/2005 | Im |
| 6,962,860 B2 | 11/2005 | Yamazaki et al. |
| 6,984,573 B2 | 1/2006 | Yamazaki et al. |
| 7,029,996 B2 | 4/2006 | Im et al. |
| 7,078,281 B2 | 7/2006 | Tanaka et al. |
| 7,078,793 B2 | 7/2006 | Ruckerbauer et al. |
| 7,091,411 B2 | 8/2006 | Falk et al. |
| 7,115,503 B2 | 10/2006 | Im |
| 7,119,365 B2 | 10/2006 | Takafuji et al. |
| 7,132,204 B2 | 11/2006 | Jung |
| 7,144,793 B2 | 12/2006 | Gosain et al. |
| 7,160,763 B2 | 1/2007 | Im et al. |
| 7,164,152 B2 | 1/2007 | Im |
| 7,172,952 B2 | 2/2007 | Chung |
| 7,183,229 B2 | 2/2007 | Yamanaka |
| 7,187,016 B2 | 3/2007 | Arima |
| 7,189,624 B2 | 3/2007 | Ito |
| 7,192,479 B2 | 3/2007 | Mitani et al. |
| 7,192,818 B1 | 3/2007 | Lee et al. |
| 7,199,397 B2 | 4/2007 | Huang et al. |
| 7,217,605 B2 | 5/2007 | Kawasaki et al. |
| 7,220,660 B2 | 5/2007 | Im et al. |
| 7,297,982 B2 | 11/2007 | Suzuki et al. |
| 7,311,778 B2 | 12/2007 | Im et al. |
| 7,318,866 B2 | 1/2008 | Im |
| 7,326,876 B2 | 2/2008 | Jung |
| 7,364,952 B2 | 4/2008 | Im |
| 7,399,359 B2 | 7/2008 | Im et al. |
| 7,622,370 B2 | 11/2009 | Im |
| 7,629,234 B2 | 12/2009 | Bruland |
| 7,645,337 B2 | 1/2010 | Im et al. |
| 7,691,687 B2 | 4/2010 | Im |
| 7,700,462 B2 | 4/2010 | Tanaka et al. |
| 7,709,378 B2 | 5/2010 | Im |
| 7,804,647 B2 | 9/2010 | Mitani et al. |
| 7,964,480 B2 | 6/2011 | Im et al. |
| 2001/0001745 A1 | 5/2001 | Im et al. |
| 2001/0029089 A1 | 10/2001 | Tanaka |
| 2001/0030292 A1 | 10/2001 | Brotherton |
| 2001/0041426 A1 | 11/2001 | Im |
| 2002/0083557 A1 | 7/2002 | Jung |
| 2002/0104750 A1 | 8/2002 | Ito |
| 2002/0119609 A1 | 8/2002 | Hatano et al. |
| 2002/0151115 A1 | 10/2002 | Nakajima et al. |
| 2002/0179004 A1 | 12/2002 | Jung |
| 2002/0197778 A1 | 12/2002 | Kasahara et al. |
| 2003/0006221 A1 | 1/2003 | Hong et al. |
| 2003/0013278 A1 | 1/2003 | Jang et al. |
| 2003/0013280 A1 | 1/2003 | Yamanaka |
| 2003/0022471 A1 | 1/2003 | Taketomi et al. |
| 2003/0029212 A1 | 2/2003 | Im |
| 2003/0057418 A1 | 3/2003 | Asano |
| 2003/0060026 A1 | 3/2003 | Yamazaki et al. |
| 2003/0068836 A1 | 4/2003 | Hongo et al. |
| 2003/0088848 A1 | 5/2003 | Crowder |
| 2003/0096489 A1 | 5/2003 | Im et al. |
| 2003/0104682 A1 | 6/2003 | Hara et al. |
| 2003/0119286 A1 | 6/2003 | Im et al. |
| 2003/0139069 A1 | 7/2003 | Block et al. |
| 2003/0148565 A1 | 8/2003 | Yamanaka |
| 2003/0148594 A1 | 8/2003 | Yamazaki et al. |
| 2003/0183270 A1* | 10/2003 | Falk et al. ............... 136/258 |
| 2003/0194613 A1 | 10/2003 | Voutsas et al. |
| 2003/0196589 A1 | 10/2003 | Mitani et al. |
| 2003/0218171 A1 | 11/2003 | Isobe et al. |
| 2004/0041158 A1 | 3/2004 | Hongo et al. |
| 2004/0053450 A1 | 3/2004 | Sposili et al. |
| 2004/0061843 A1 | 4/2004 | Im |
| 2004/0127066 A1 | 7/2004 | Jung |
| 2004/0140470 A1 | 7/2004 | Kawasaki et al. |
| 2004/0169176 A1 | 9/2004 | Peterson et al. |
| 2004/0182838 A1 | 9/2004 | Das et al. |
| 2004/0209447 A1 | 10/2004 | Gosain et al. |
| 2004/0222187 A1 | 11/2004 | Lin |
| 2004/0224487 A1 | 11/2004 | Yang |
| 2005/0003591 A1 | 1/2005 | Takaoka et al. |
| 2005/0032249 A1 | 2/2005 | Im et al. |
| 2005/0034653 A1 | 2/2005 | Im et al. |
| 2005/0059222 A1 | 3/2005 | You |
| 2005/0059223 A1 | 3/2005 | Im |
| 2005/0059224 A1 | 3/2005 | Im |
| 2005/0059265 A1 | 3/2005 | Im |
| 2005/0112906 A1 | 5/2005 | Maekawa et al. |
| 2005/0139830 A1 | 6/2005 | Takeda et al. |
| 2005/0141580 A1 | 6/2005 | Partlo et al. |
| 2005/0142450 A1 | 6/2005 | Jung |
| 2005/0142451 A1 | 6/2005 | You |
| 2005/0202654 A1 | 9/2005 | Im |
| 2005/0235903 A1 | 10/2005 | Im et al. |
| 2005/0236908 A1 | 10/2005 | Rivin |
| 2005/0255640 A1 | 11/2005 | Im et al. |
| 2005/0282319 A1 | 12/2005 | Bruland et al. |
| 2006/0030164 A1 | 2/2006 | Im |
| 2006/0035478 A1 | 2/2006 | You |
| 2006/0040512 A1 | 2/2006 | Im |
| 2006/0060130 A1 | 3/2006 | Im |
| 2006/0102901 A1 | 5/2006 | Im et al. |
| 2006/0125741 A1 | 6/2006 | Tanaka et al. |
| 2006/0134890 A1 | 6/2006 | Im |
| 2006/0211183 A1 | 9/2006 | Duan et al. |
| 2006/0254500 A1 | 11/2006 | Im et al. |
| 2007/0007242 A1 | 1/2007 | Im |
| 2007/0010074 A1 | 1/2007 | Im |
| 2007/0010104 A1 | 1/2007 | Im et al. |
| 2007/0012664 A1 | 1/2007 | Im |
| 2007/0020942 A1 | 1/2007 | Im |
| 2007/0032096 A1 | 2/2007 | Im |
| 2007/0051302 A1 | 3/2007 | Gosain et al. |
| 2007/0054477 A1 | 3/2007 | Kim et al. |
| 2007/0108472 A1 | 5/2007 | Jeong et al. |
| 2007/0111349 A1 | 5/2007 | Im |
| 2007/0145017 A1 | 6/2007 | Im et al. |
| 2007/0184638 A1 | 8/2007 | Kang et al. |
| 2007/0215877 A1 | 9/2007 | Kato et al. |
| 2007/0215942 A1 | 9/2007 | Chen et al. |
| 2008/0035863 A1 | 2/2008 | Im et al. |
| 2008/0124526 A1 | 5/2008 | Im |
| 2008/0176414 A1 | 7/2008 | Im |
| 2009/0001523 A1 | 1/2009 | Im |
| 2009/0137105 A1 | 5/2009 | Im |
| 2009/0140173 A1 | 6/2009 | Im |
| 2009/0218577 A1 | 9/2009 | Im |
| 2009/0242805 A1 | 10/2009 | Im |
| 2009/0309104 A1 | 12/2009 | Im et al. |
| 2010/0024865 A1 | 2/2010 | Shah et al. |
| 2010/0187529 A1 | 7/2010 | Im |
| 2011/0248278 A1 | 10/2011 | Im et al. |
| 2011/0309370 A1 | 12/2011 | Im |

FOREIGN PATENT DOCUMENTS

| | | |
|---|---|---|
| DE | 101 03 670 A1 | 8/2002 |
| EP | 655774 | 5/1995 |
| EP | 681316 | 11/1995 |
| EP | 1067593 | 1/2001 |
| GB | 2338342 | 12/1999 |
| GB | 2338343 | 12/1999 |
| GB | 2338597 | 12/1999 |
| JP | S57-027035 | 2/1982 |
| JP | 62160781 | 7/1987 |
| JP | 62181419 | 8/1987 |
| JP | 62216320 | 9/1987 |
| JP | H01-256114 | 10/1989 |
| JP | 2081422 | 3/1990 |
| JP | 2283036 | 11/1990 |
| JP | 04033327 | 2/1992 |
| JP | 04-279064 | 10/1992 |
| JP | 5041519 | 2/1993 |
| JP | 5048190 | 2/1993 |
| JP | 06-011729 | 1/1994 |
| JP | 6252048 | 9/1994 |

(56) References Cited

FOREIGN PATENT DOCUMENTS

| | | |
|---|---|---|
| JP | H06-260502 | 9/1994 |
| JP | 6283422 | 10/1994 |
| JP | 7176757 | 7/1995 |
| JP | 08078330 | 3/1996 |
| JP | H09-007968 | 1/1997 |
| JP | 9171971 A | 6/1997 |
| JP | 9260681 A | 10/1997 |
| JP | H09-270393 | 10/1997 |
| JP | 9321210 A | 12/1997 |
| JP | 10189998 | 7/1998 |
| JP | H10-244390 | 9/1998 |
| JP | 11025064 A | 1/1999 |
| JP | 11064883 | 3/1999 |
| JP | 11-281997 | 10/1999 |
| JP | 11297852 | 10/1999 |
| JP | 11330000 A | 11/1999 |
| JP | 2000223425 | 8/2000 |
| JP | 2000-315652 | 11/2000 |
| JP | 2000346618 | 12/2000 |
| JP | 2001023920 | 1/2001 |
| JP | 2002-203809 | 7/2002 |
| JP | 2002-353142 | 12/2002 |
| JP | 2002353159 A | 12/2002 |
| JP | 2003-031496 | 1/2003 |
| JP | 20003100653 | 4/2003 |
| JP | 2004031809 | 1/2004 |
| JP | 2004-311935 | 11/2004 |
| TW | 457553 B | 10/2001 |
| TW | 464960 A1 | 11/2001 |
| TW | 564465 A | 12/2003 |
| TW | 569350 B | 1/2004 |
| WO | WO-97/45827 | 12/1997 |
| WO | WO-98/24118 | 6/1998 |
| WO | WO-99/31719 | 6/1999 |
| WO | WO-00/14784 | 3/2000 |
| WO | WO-01/18854 | 3/2001 |
| WO | WO-01/18855 | 3/2001 |
| WO | WO-01/71786 | 9/2001 |
| WO | WO-01/71791 | 9/2001 |
| WO | WO-01/73769 A1 | 10/2001 |
| WO | WO-02/31869 | 4/2002 |
| WO | WO-0231869 A2 | 4/2002 |
| WO | WO-02/42847 | 5/2002 |
| WO | WO-02/86954 | 5/2002 |
| WO | WO-02/086955 | 10/2002 |
| WO | WO-03/018882 | 3/2003 |
| WO | WO-03/046965 | 6/2003 |
| WO | WO-03/084688 | 10/2003 |
| WO | WO-2004/017379 | 2/2004 |
| WO | WO-2004/017380 | 2/2004 |
| WO | WO-2004/017381 | 2/2004 |
| WO | WO-2004/017382 | 2/2004 |
| WO | WO-2004/075263 | 9/2004 |
| WO | WO-2005/029546 | 3/2005 |
| WO | WO-2005/029548 | 3/2005 |
| WO | WO-2005/029550 | 3/2005 |
| WO | WO-2005/029551 | 3/2005 |
| WO | WO-2005/054949 A2 | 6/2005 |
| WO | WO-2006/055003 A1 | 5/2006 |

OTHER PUBLICATIONS

Biegelsen, D.K., L.E. Fennell and J.C. Zesch, Origin of oriented crystal growth of radiantly melted silicon on SiO/sub 2, Appl. Phys. Lett. 45, 546 (1984).
Boyd, I. W., "Laser Processing of Thin Films and Microstructures, Oxidation, Deposition and Etching of Insulators," (Springer-Verlag Berlin Heidelber, 1987.
Broadbent et al., "Excimer Laser Processing of Al-1%Cu/TiW Interconnect Layers," Proceedings, Sixth International IEEE VLSI Multilevel Interconnection Conference, Santa Clara, CA, Jun. 12-13, pp. 336-345 (1989).
Brotherton et al., "Influence of Melt Depth in Laser Crystallized Poly-Si Thin Film Transistors," Journal of Appl. Phys., 82:4086 (1997).
Brotherton, "Polycrystalline Silicon Thin Film Transistors," Semicond. Sci. Tech., 10:721-738 (1995).
Brotherton, S.D., et al., Characterisation of poly-Si TFTs in Directionally Solidified SLS Si, Asia Display/IDW'01, p. 387-390.
Crowder et al., "Low-Temperature Single-Crystal Si TFT's Fabricated on Si Films Processed via Sequential Lateral Solidification," IEEE Electron Device Letter, 19 (8): 306 (1998).
Crowder et al., "Parametric Investigation of SLS-processed Polysilicon Thin Films for TFT Applications," Preparations and Characterization, Elsevier, Sequoia, NL, vol. 427, No. 1-2, Mar. 3, 2003, pp. 101-107, XP004417451.
Crowder et al., "Sequential Lateral Solidification of PECVD and Sputter Deposited a-Si Films", Mat. Res. Soc. Symp. Proc. 621:Q.9. 7.1-9.7.6, 2000.
Dassow, R. et al. Laser-Crystallized Polycrystalline Silicon on Glass for Photovoltaic Applications, Solid State Phenomena, pp. 193-198, vols. 67-68, Scitec Publications, Switzerland.
Dassow, R. et al. Nd:YVO4 Laser Crystallization for Thin Film Transistors with a High Mobility, Mat. Res. Soc. Symp. Proc., 2000, Q9.3.1-Q9.3.6, vol. 621, Materials Research Society.
Dassow, R. et al., Laser crystallization of silicon for high-performance thin-film transistors, Semicond. Sci. Technol., 2000, pp. L31-L34, vol. 15, UK.
Dimitriadis, C.A., J. Stoemenos, P.A. Coxon, S. Friligkos, J. Antonopoulos and N.A. Economou, Effect of pressure on the growth of crystallites of low-pressure chemical-vapor-deposited polycrystalline silicon films and the effective electron mobility under high normal field in thin-film transistors, J. Appl. Phys. 73, 8402 (1993).
Endert et al., "Excimer Laser: A New Tool for Precision Micromachining," Optical and Quantum Electronics, 27:1319 (1995).
Fogarassy et al., "Pulsed Laser Crystallization of Hydrogen-Free a-Si Thin Films for High-Mobility Poly-Si TFT Fabrication," Applied Physics A—Solids and Surfaces, 56:365-373 (1993).
Geis et al., "Crystallographic orientation of silicon on an amorphous substrate using an artificial surface-relief grating and laser crystallization," Appl. Phys. Lett. 35(1) Jul. 1, 1979, 71-74.
Geis et al., "Silicon graphoepitaxy using a strip-heater oven," Appl. Phys. Lett. 37(5), Sep. 1, 1980, 454-456.
Geis et al., "Zone-Melting recrystallization of Si Films with a moveable-strip heater oven," J. Electro-Chem. Soc., 129: 2812 (1982).
Gosain et al., "Formation of (100)-Textured Si Film Using an Excimer Laser on a Glass Substrate," Jpn. J. Appl. Phys., vol. 42 (2003) pp. L135-L137.
Gupta et al., "Numerical Analysis of Excimer-laser induced melting and solidification of Si Thin Films", Applied Phys. Lett., 71:99, 1997.
Hau-Riege et al., "The Effects Microstructural Transitions at Width Transitions on interconnect reliability," Journal of Applied Physics, 87(12): 8467-8472.
Hawkins, W.G. et al., "Origin of lamellae in radiatively melted silicon flims," Appl. Phys. Lett. 42(4), Feb. 15, 1983.
Hayzelden, C. and J.L. Batstone, Silicide formation and silicide-mediated crystallization of nickel-implanted amorphous silicon thin films, J. Appl. Phys. 73, 8279 (1993).
Im et al., "Controlled Super-Lateral Growth of Si Films for Microstructural Manipulation and Optimization," Phys. Stat. Sol. (a), 166:603 (1998).
Im et al., "Crystalline Si Films for Integrated Active-Matrix Liquid-Crystals Displays," MRS Bulletin, 21:39 (1996).
Im et al., "On the Super Lateral Growth Phenomenon Observed in Excimer Laser-Induced Crystallization of Thin Si Films," Appl. Phys. Lett., 64 (17): 2303 (1994).
Im et al., "Phase Transformation Mechanisms Involved in Excimer Laser Crystallization of Amorphous Silicon Films," Appl. Phys. Lett., 63 (14): 1969 (1993).
Im et al., "Single-Crystal Si Films for Thin-Film Transistor Devices," Appl. Phys. Lett., 70(25): 3434 (1997).
Im, J.S., Method and system for producing crystalline thin films with a uniform crystalline orientation, application # 60/503419; ref. file # 36013(BB); Columbia ref. M02-063.

(56) References Cited

OTHER PUBLICATIONS

Ishida et al., "Ultra-shallow boxlike profiles fabricated by pulsed ultraviolet-laser doping process," J. Vac. Sci. Technol. B 12(1): 399-403, (1994).
Ishihara et al., "A Novel Double-Pulse Excimer-Laser Crystallization Method of Silicon Thin-Films," Publication Office, Japanese Journal of Applied Physics, Tokyo, Japan, 34(8A): 3976-3981 (1995).
Jeon et al., "Two-step laser recrystallization of poly-Si for effective control of grain boundaries," Journal of Non Crystalline Solids, 266-269: 645-649 (2000).
Jung, Y.H., et al., Low Temperature Polycrystalline Si TFTs Fabricated with Directionally Crystallized Si Film, Mat. Res. Soc. Symp. Proc. vol. 621, Z8.3.1-6, 2000.
Jung, Y.H., et al., The Dependence of Poly-Si TFT Characteristics on the Relative Misorientation Between Grain Boundaries and the Active Channel, Mat. Res. Soc. Symp. Proc. vol. 621, Q9.14.1-6, 2000.
Kahlert, H., "Creating Crystals," OE Magazine, Nov. 2001, 33-35.
Kim et al., "Grain Boundary Location-Controlled Poly-Si Films for TFT Devices Obtained Via Novel Excimer Laser Process," Mat. Res. Soc. Symp. Proc., vol. 358, 1995.
Kim et al., "Multiple Pulse Irradiation Effects in Excimer Laser-Induced Crystallization of Amorphous Si Films," Mat. Res. Soc. Sym. Proc., 321:665-670 (1994).
Kim, "Excimer-Laser-Induced Crystallization of Amorphous Silicon Thin Films," Ph. D. Dissertation Abstract, Columbia University, 1996.
Kim, C. et al., "Development of SLS-Based SOG Display," IDMC 2005, pp. 252-255.
Kim, H. J. et al., "Excimer Laser Induced Crystallization of Thin Amorphous Si Films on SiO2: Implications of Crystallized Microstructures for Phase Transformation Mechanisms," Mat. Res. Soc. Symp. Proc., vol. 283, 1993.
Kim, H.-J., et al., "The effects of dopants on surface-energy-driven secondary grain growth in silicon films," J. Appl. Phys. 67 (2), Jan. 15, 1990.
Kim, H.J. et al., "New Excimer-laser-crystallization method for producing large-grained and grain boundary-location-controlled Si Films for Thin Film Transistors", Applied Phys. Lett., 68: 1513.
Kimura, M. and K. Egami, Influence of as-deposited film structure on (100) texture in laser-recrystallized silicon on fused quartz, Appl. Phys. Lett. 44, 420 (1984).
Knowles, D.S. et al., "P-59: Thin Beam Crystallization Method: a New Laser Annealing Tool with Lower Cost and Higher Yield for LTPS Panels," SID 00 Digest, pp. 1-3.
Kohler, J.R. et al., Large-grained polycrystalline silicon on glass by copper vapor laser annealing. Thin Solid Films, 1999, pp. 129-132, vol. 337, Elsevier.
Kung, K.T.Y. and R. Reif, Implant-dose dependence of grain size and (110) texture enhancements in polycrystalline Si films by seed selection through ion channeling, J. Appl. Phys. 59, 2422 (1986).
Kung, K.T.Y., R.B. Iverson and R. Reif, Seed selection through ion channeling to modify crystallographic orientations of polycrystalline Si films on SiO/sub 2/:Implant angle dependence, Appl. Phys. Lett. 46, 683 (1985).
Kuriyama, H., T. Nohda, S. Ishida, T. Kuwahara, S. Noguchi, S. Kiyama, S. Tsuda and S. Nakano, Lateral grain growth of poly-Si films with a specific orientation by an excimer laser annealing method, Jpn. J. Appl. Phys. 32, 6190 (1993).
Kuriyama, H., T. Nohda, Y. Aya, T. Kuwahara, S. Wakisaka, S. Kiyama and S. Tsuda, Comprehensive study of lateral grain growth in poly-Si films by excimer laser annealing and its application to thin film transistors, Jpn. J. Appl. Phys. 33, 5657 (1994).
Lee, S.-W. and S.-K. Joo, Low temperature poly-Si thin-film transistor fabrication by metal-induced lateral crystallization, IEEE Electron Device Letters 17, 160 (1996).
Lee, S.-W., Y.-C. Jeon and S.-K. Joo, Pd induced lateral crystallization of amorphous Si thin films, Appl. Phys. Lett. 66, 1671 (1995).
Leonard, J.P. et al, "Stochastic modeling of solid nucleation in supercooled liquids", Appl. Phys. Lett. 78:22, May 28, 2001, 3454-3456.
Limanov, A. et al., Single-Axis Projection Scheme for Conducting Sequential Lateral Solidification of Si Films for Large-Area Electronics, Mat. Res. Soc. Symp. Proc., 2001, D10.1.1-D10.1.7, vol. 685E, Materials Research Society.
Limanov, A. et al., The Study of Silicon Films Obtained by Sequential Lateral Solidification by Means of a 3-k-Hz Excimer Laser with a Sheetlike Beam, Russian Microelectronics, 1999, pp. 30-39, vol. 28, No. 1, Russia.
Limanov, A.B., et al., Development of Linear Sequential Lateral Solidification Technique to Fabricate Quasi-Single-Cyrstal Superthin Si Films for High-Performance Thin Film Transistor Devices, Perspectives, Science, and Technologies for Novel Silicon on Insulator Devices, Eds. P.L.F. Hemment, Kluwer Academic Publishers 2000, pp. 55-61.
Mariucci et al., "Grain boundary location control by patterned metal film in excimer laser crystallized polysilicon," Proceedings of the Fifth International Conference on Polycrystalline Semiconductors, Schwabisch Gmund, Germany, 67-68: 175-180 (1998).
McWilliams et al., "Wafer-Scale Laser Pantography: Fabrication of N-Metal-Oxide-Semiconductor Transistors and Small-Scale Integrated Circuits by Direct-Write Laser-Induced Pyrolytic Reactions," Applied Physics Letters, American Institute of Physics, New York, US, 43(10): 946-948 (1983).
MICRO/LAS Lasersystem GMBH, "Overview of Beam Delivery Systems for Excimer Lasers," (1999).
MICRO/LAS Lasersystem GMBH, "UV Optics Systems for Excimer Laser Based Micromachining and Marking," (1999).
Miyasaka, M., K. Makihira, T. Asano, E. Polychroniadis and J. Stoemenos, in situ observation of nickel metal-induced lateral crystallization of amorphous silicon thin films, Appl. Phys. Lett. 80, 944 (2002).
Miyata et al, "Low-Temperature Polycrystalline Silicon Thin-Film Transistors for Large-Area Liquid Crystal Display," Japanese J. of Applied Physics, Part 1—Regular Papers Short Notes & Review Papers, 31:4559-62 (1992).
Nebel, "Laser Interference Structuring of A-Si:h" Amorphous Silicon Technology—1996, San Francisco, CA Apr. 8-12, Materials Research Society Symposium Proceedings, vol. 420, Pittsburgh, PA (1996).
Nerding, M., S. Christiansen, R. Dassow, K. Taretto, J.R. Kohler and H.P. Strunk, Tailoring texture in laser crystallization of silicon thin-films on glass, Solid State Phenom. 93, 173 (2003).
Noguchi, "Appearance of Single-Crystalline Properties in Fine-Patterned Si Thin Film Transistors (TFTs) by Solid Phase Crystallization (SPC)," Jpn. J. Appl. Phys., 32:L1584-L1587 (1993).
Ozawa et al., "Two-Dimensionally Position-Controlled Excimer-Laser-Crystallization of Silicon Thin Films on Glassy Substrate," Jpn. J. Appl. Phys. 38(10):5700-5705 (1999).
Sato et al., "Mobility anisotropy of electrons in inversion layers on oxidized silicon surfaces," Physical Review B (State) 4, 1950 (1971).
Smith, H.I. et al, "The Mechanism of Orientation in Si Graphoepitaxy by Laser Strip Heater Recrystallization," J. Electrochem. Soc.: Solid-State Science and Technology, vol. 130, No. 10, Oct. 1983, pp. 2050-2053.
Song et al., "Single Crystal Si Islands on SiO2 Obtained Via Excimer Laser Irradiation of a Patterned Si Film", Applied Phys. Lett., 68:3165, 1996.
Sposili et al., "Line-scan sequential lateral solidification of Si thin films", Appl. Phys. A67, 273-6, 1998.
Sposili et al., "Sequential Lateral Solidification of Thin Silicon Films on SiO2," Appl. Phys. Lett., 69(19): 2864 (1996).
Sposili et al., "Single-Crystal Si Films via a Low-Substrate-Temperature Excimer-Laser Crystallization Method," Mat. Res. Soc. Symp. Proc., 452: 953-958 (1997).
Thompson, C.V. and H.I. Smith, Surface-energy-driven secondary grain growth in ultrathin (<100 nm) films of silicon, Appl. Phys. Lett. 44, 603 (1984).
van der Wilt, P.C. et al., "State-of-the-Art Laser Crystallization of Si for Flat Panel Displays," PhAST, May 18, 2004, pp. 1-34.
van der Wilt, P.C. et al., "The Commercialization of the SLS Technology," Taiwan FPD, Jun. 11, 2004, pp. 1-12.
van der Wilt, P.C., "Textured poly-Si films for hybrid SLS," Jul. 2004, pp. 1-5.

(56) References Cited

OTHER PUBLICATIONS

Voutsas, A. T., "Assessment of the Performance of Laser-Based Lateral-Crystallization Technology via Analysis and Modeling of Polysilicon Thin-Film-Transistor Mobility," IEEE Transactions on Electronic Devices, vol. 50, No. 6, Jun. 2003.

Voutsas, A.T. et al.: "Effect of process parameters on the structural characteristics of laterallyy grown, laser-annealed polycrystalline silicon films," Journal of applicaed Physics, vol. 94, No. 12, Dec. 15, 2003.

Voutsas, A.T., A new era of crystallization: advances in polysilicon crystallization and crystal engineering, Applied Surface Science 250-262, 2003.

Watanabe et al., "Crystallization Process of Polycrystalline Silicon by KrF Excimer Laser Annealing," Japanese J. of Applied Physics, Part 1—Regular Papers Short Notes & Review Papers, 33:4491-98 (1994).

Weiner, K. H. et al. "Laser-assisted, Self-aligned Silicide Formation," A Verdant Technologies technical brief, Aug. 7, 1997, 1-9.

Weiner, K. H. et al., "Ultrashallow Junction Formation Using Projection Gas Immersion Laser Doping (PGILD)," A Verdant Technologies Technical Brief, Aug. 20, 1997.

Werner, J.H., et al. From polycrystalline to single crystalline silicon on glass, Thin Solid Films 383, 95-100, 2001.

White et al., "Characterization of thin-oxide MNOS memory transistors," IEEE Trans. Electron Devices ED-19, 1280 (1972).

Yamamuchi et al., "Polycrystalline silicon thin films processed with silicon ion implantation and subsequent solid-phase crystallization: Theory, experiments, and thin-film transistor applications," Journal of Applied Physics, 75(7):3235-3257 (1994).

Yoshimoto et al., "Excimer-Laser-Produced and Two-Dimensionally Position-Controlled Giant Si Grains on Organic SOG Underlayer," p. 285-286, AM-LCD (2000).

Jeon et al., "New Excimer Laser Recrystallization of Poly-Si for Effective Grain Growth and Grain Boundary Arrangement," Jpn. J. Appl. Phys. vol. 39 (2000) pp. 2012-2014, Part 1, No. 4B, Apr. 2000.

Andrä et al., "A new technology for crystalline silicon thin film solar cells on glass based on the laser crystallization," IEEE, pp. 217-220 (2000).

Andrä et al., "Multicrystalline Llc-Si thin film solar cells on low temperature glass," Poster, 3rd world Conference on Photovoltaic Energy Conversion, Osaka, Japan, pp. 1174-1177, May 11-18, 2003.

Sinke et al., "Explosive crystallization of amorphous silicon: Triggering and propagation," Applied Surface Science, vol. 43, pp. 128-135 (1989).

Geiler, H.D., et al., "Explosive Crystallization in Silicon", J. Appl. Phys., May 1, 1986, vol. 59, pp. 3091-3099.

International Search Report for corresponding International Patent Application No. PCT/US2010/033565, mailed Jul. 1, 2010, 1 page.

International Search Report for corresponding International Patent Application No. PCT/US2010/055106, mailed Jan. 4, 2011, 1 page.

Van Der Wilt, "A hybrid approach for obtaining orientation-controlled single-crystal Si regions on glass substrates," Proc. of SPIE vol. 6106, 61060B-1 to B-15, (2006).

\* cited by examiner

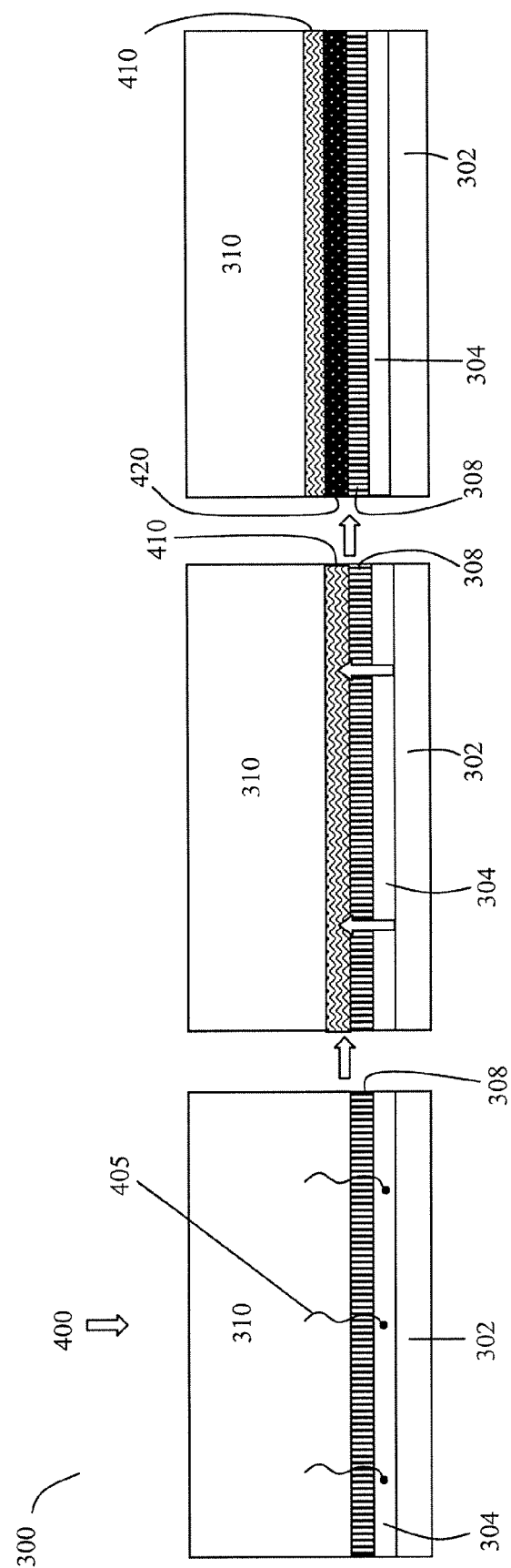

SYSTEMS AND METHODS FOR PREPARATION OF EPITAXIALLY TEXTURED THICK FILMS

CROSS REFERENCE TO RELATED APPLICATIONS

This application claims the benefit under 35 U.S.C. §119(e) of the following applications, the entire contents of which are incorporated herein by reference:

U.S. Provisional Application No. 60/989,729, filed on Nov. 21, 2007, entitled "Methods and Systems for Backside Laser Induced Epitaxial Growth of Thick Film"; and U.S. Provisional Application No. 61/012,229, filed on Dec. 7, 2007, entitled "Methods and Systems for Backside Laser Induced Epitaxial Growth of Thick Film."

All patents, patent applications and patent publications cited herein are hereby incorporated by reference in their entirety.

This application is related to the commonly owned and co-pending application filed on even date herewith and entitled "Systems and Methods for Preparing Epitaxially Textured Polycrystalline Films," the contents of which are incorporated by reference in their entirety.

BACKGROUND

The subject matter described herein relates to systems and methods for preparation of epitaxially grown textured thick films.

A thick film is particularly useful in solar cell applications because a thicker film can absorb more photons and thereby produce more electricity. A solar cell or photovoltaic cell is a device that converts light energy into electrical energy. A solar or photovoltaic cell generates electricity in a light absorbing material upon exposure of the material to light. When light energy strikes the solar cell, the photovoltaic effect produces electricity.

The light absorbing material is typically a semiconductor material. There are currently several different semiconducting materials used in solar cells and a common material is silicon. The most efficient form of silicon (e.g., to capture the greatest amount of energy from the incident light) is as a single crystal silicon. However, single-crystal silicon wafers are costly. In many photovoltaic applications, the silicon used is a relatively thick polycrystalline or amorphous silicon film. For example, a film having a thickness of about 1 µm to up to 20 µm can be used. Polycrystalline silicon or amorphous silicon can be used in an attempt to reduce manufacturing costs. However, the resulting cells are not as efficient as cells using single crystal silicon.

Silicon thin-films can be made through chemical vapor deposition (CVD) (for example plasma-enhanced (PECVD)) from, for example, silane gas and hydrogen gas. Depending on the deposition's parameters, this can yield amorphous silicon (a-Si) or polycrystalline silicon (poly-Si). The solar cells made from these materials tend to have lower energy conversion efficiency than bulk silicon, but are also less expensive to produce and they can be produced on large surfaces.

SUMMARY

The disclosed subject matter relates to the use of laser crystallization of thin films to create epitaxially textured crystalline thick films.

In one or more embodiments, a method for preparing a thick crystalline film includes providing a film for crystallization on a substrate, wherein at least a portion of the substrate is substantially transparent to laser irradiation, said film including a seed layer having a predominant surface crystallographic orientation; and a top layer disposed above the seed layer; irradiating the film from the back side of the substrate using a pulsed laser to melt a first portion of the top layer at an interface with the seed layer while a second portion of the top layer remains solid; and re-solidifying the first portion of the top layer to form a crystalline laser epitaxial with the seed layer thereby releasing heat to melt an adjacent portion of the top layer.

In one or more embodiments, the seed layer includes a polycrystalline silicon.

In one or more embodiments, the top layer includes amorphous silicon.

In one or more embodiments, the top layer has a predominant surface crystallographic orientation of {111} orientation.

In one or more embodiments, the top layer has a predominant surface crystallographic orientation of {100} orientation.

In one or more embodiments, the top layer has a thickness that is greater than the seed layer.

In one or more embodiments, the seed layer is deposited using a technique selected from the group consisting of zone melt recrystallization (ZMR), solid phase recrystallization, chemical vapor deposition (CVD), sputtering, evaporation, surface-energy-driven secondary grain growth (SEDSGG), mixed-phase solidification and pulsed laser crystallization methods.

In one or more embodiments, the method includes backside irradiating the seed layer using pulsed irradiation to increase the texture of the seed layer through the thickness of the seed layer.

In one or more embodiments, the top layer is deposited using a method selected from the group consisting of low pressure chemical vapor deposition (CVD), plasma enhanced CVD, physical deposition techniques and sputter deposition.

In one or more embodiments, the film includes a material selected from the group consisting of metal and semiconductor materials.

In one or more embodiments, the top layer has a thickness in the range of 1 µm to about 20 µm.

In one or more embodiments, the seed layer has a thickness in the range of 50 nm to about 1 µm.

In one or more embodiments, the step of irradiating the film includes irradiating with a continuous wave or excimer laser.

In one or more embodiments, the method includes heating the film from the top surface of the film.

In one or more embodiments, heating includes co-irradiation from front side of film.

In one or more embodiments, heating includes contact with heated surface.

In one or more embodiments, the irradiation melts the entire top layer.

In one or more embodiments, a method for preparing a thick crystalline film includes providing a film for crystallization on a substrate, wherein at least a portion of the substrate is transparent to laser irradiation, said film including a seed layer having predominant surface crystallographic orientation; a top layer disposed above the seed layer; and a metal layer disposed below the seed layer; irradiating the film using a pulsed laser at a wavelength absorbable by the metal to heat the metal layer, said heat being transferred to the top layer to melt a first portion of the top layer at an interface with the seed layer while a second portion of the top layer remains solid; re-solidifying the first portion of the top layer to form a crystalline layer epitaxial with the seed layer thereby releasing heat to melt an adjacent portion of the top layer.

In one or more embodiments, the step of irradiating is directed through the front side of the film.

In one or more embodiments, a portion of the light is absorbed by the film.

In one or more embodiments, the step of irradiating is directed through the back side of the film.

In one or more embodiments, the method includes providing a buffer layer between the seed layer and the metal film.

In one or more embodiments, a method of making a solar cell including preparing a crystalline silicon layer by providing a film for crystallization on a substrate, wherein at least a portion of the substrate is transparent to laser irradiation, said film including a seed layer including crystal grains having a surface texture; and a top layer disposed above the low defect density seed layer, said top layer having a thickness that is greater than the seed layer; irradiating the film from the back side of the substrate using a pulsed laser to melt a portion of the low quality layer at an interface with the seed layer, wherein crystals grow epitaxially from the seed layer; and disposing the polycrystalline silicon layer between two electrodes.

In one or more embodiments, the top layer has a thickness that is greater than the seed layer.

In one or more embodiments, a system for preparing a thick crystalline film includes a substrate, wherein at least a portion of the substrate is transparent to laser irradiation, said film including a film for crystallization disposed upon the substrate, the film including a seed layer including crystal grains having a surface texture; and a top layer disposed above the seed layer; means for irradiating the film from the back side of the substrate using a pulsed laser to melt a first portion of the top layer at an interface with the seed layer while a second portion of the top layer remains solid; and means for growing the first portion of a crystalline material to form an epitaxial layer on the seed layer, thereby releasing heat sufficient to melt an adjacent portion of the top layer.

In one or more embodiments, the top layer has a thickness that is greater than the seed layer.

BRIEF DESCRIPTION OF THE DRAWINGS

The foregoing and other features of the embodiments described herein will be apparent from the following more particular description, as illustrated in the accompanying drawings.

FIGS. 4a-4c are schematic illustrations of a front side irradiation process of a thick film where a metal film is located between the substrate and the seed layer according to one or more embodiments described herein.

DETAILED DESCRIPTION

Figure 1:
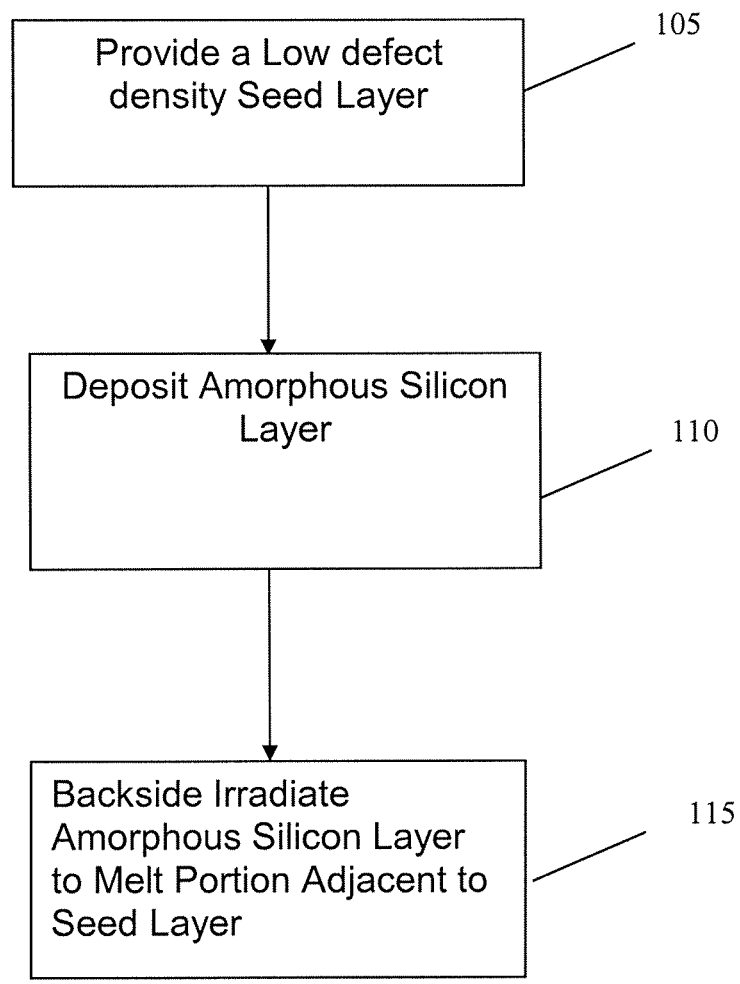
FIG. 1 schematically illustrates a laser irradiation method in accordance with one or more embodiments described herein.

Conventionally, the epitaxial growth of thin films is conducted using a chemical vapor deposition (CVD) process performed at high temperatures to ensure high quality reproduction of the seed layer's lattice orientation. However, such processes require the use of substrates that can withstand high temperatures. If transparency of the substrate is also required or desired, as may be the case for solar cells, the substrate needs to be made of quartz or specialized high-temperature glasses. These substrates can be costly and may not be available in large dimensions. In addition, epitaxy via CVD typically may have very low deposition rates.

Previously, epitaxial films have been prepared by depositing a thick defective layer, also referred to herein as a "top layer" (e.g., an amorphous silicon (a-Si) layer or polycrystalline silicon films (p-Si)) on a thin crystalline seed layer (c-Si)) and melting the a-Si layer to provide an epitaxially grown layer from the crystalline seed layer using melt-mediated epitaxy. To epitaxially grow the silicon layer, the film is irradiated from the front side, i.e., the non-substrate side of the film, to melt completely the a-Si layer without substantially melting the underlying c-Si layer. Thus, the crystalline layer grows from the interface of the liquid-solid interface between the seed layer and the melt. However, this process can be difficult to control. Because the desired thickness of the a-Si layer is typically greater than that of the seed layer, it is difficult to melt only the deposited a-Si layer. This difficulty can arise from non-uniformities in the irradiation process including pulse-to-pulse energy variation. Significant care is required to avoid undesired melting of the seed layer along with the a-Si layer. Furthermore, the melt and grow process may need to be carried out multiple times. Typically, the thickness of the a-Si layer can range from 20 nm to 80 nm or more, e.g. 500 nm. Since the films are deposited on crystalline Si seed layers that are conductive to heat, higher energy density radiation may be needed to fully melt the film than if it were deposited on less conductive substrates, such as silicon dioxide. The high energy density that is required to deposit sufficient heat to completely melt the defective film can lead to damaging of the surface, for example through evaporation or through agglomeration. This limits the maximum thickness of the defective layer that can be fully molten without inducing damage. This is yet another reason why multiple depositions and radiations may be needed to reach satisfactory thickness of the photon absorption layer. Thin film solar cells typically have silicon layers on the order of about 1 μm to about 20 μm or more. Thus, many iterations of a-Si deposition and liquid phase epitaxial growth are required to obtain the desired thickness. This process can be time-consuming, costly, and inefficient.

The laser-irradiation epitaxial process, as described herein, provides good quality epitaxy and is compatible with low temperature substrates such as low temperature glass. The method includes inducing a limited degree of melting in the film and triggering a self-sustained process known as explosive crystallization. Explosive crystallization can take place as a result of the difference in melting temperatures of amorphous and crystalline materials. Amorphous silicon has a lower melting temperature than crystalline silicon ($T_{a-Si} < T_{c-Si}$), which helps to inhibit the melting of the seed crystalline layer and to promote the preferential melting of the amorphous silicon layer. Further, amorphous silicon is in a meta-stable state and has a higher free energy. Conversion of a meta-stable material such as amorphous silicon into a more stable material such as crystalline silicon (as a result of melt irradiation, followed by crystallization) results in a net reduction of energy, and therefore releases latent energy upon crystallization. In a crystallization process, this can translate into heat. Since crystallization of the amorphous materials results in the release of energy, it is possible to use the released energy to melt adjacent amorphous regions and to cause further crystallization. In many instances, the crystallization process can be self-sustaining and only need be initiated for crystallization to propagate through the amorphous body.

Aspects of the method are described with reference to FIG. 1. For clarity of explanation, the method is described with reference to silicon films. However, it is apparent that the method can be applied to other materials. For example, the film can be a metal alloy or semiconductor film. Metal alloys can include nickel titanium. Semiconductor films can include conventional semiconductor materials, such as silicon, germanium, and silicon-germanium. In some embodiments, the defective material is a-Si.

The first step includes providing a seed layer on a substrate (105 in FIG. 1). In this example, 105 refers to the label of the block in the flowchart of FIG. 1. The seed layer has the desired crystallographic orientation.

Low defect density seed layers provide good substrates from which to epitaxially grow a low defect density (epitaxial) thick film. Thus, large grained, crystallographically oriented Si films can be produced having a low defect density. Low defect density films are characterized by a low number of grain boundaries and few intergrain defects, e.g., significantly less than $10^9$ defect/$\mu m^2$. The seed layer can be relatively thin, e.g., between about 50 and 1,000 nm or between about 100 and 200 nm.

Conventional methods of obtaining a precursor textured film (which can be subsequently treated to form a large crystalline grain film) include zone melt recrystallization (ZMR), solid phase crystallization, direct deposition techniques (CVD, sputtering, evaporation), surface-energy-driven secondary grain growth (SEDSGG) and pulsed laser crystallization (multiple-pulse ELA) methods. Zone melt irradiation using a radiative source of heating can produce silicon films having {100} surface orientation as described by M. W. Geis et. al., "Zone-Melting recrystallization of Si films with a moveable-strip-heater oven," J. Electro-Chem. Soc. 129, 2812 (1982). Other methods for producing (100) textured films include CVD and low-pressure CVD. See, e.g., *J. Electrochem. Soc.* Vol. 134, NO. 134, pp. 2541-2545 (October, 1987); *J. Appl. Phys.*, Vol. 73, No. 12, pp. 8402-8411 (June, 1993); and *J. Matl. Sci. Lett.*, Vol. 7, pp. 247-250 (1988), or by aluminum induced crystallization; see e.g., O. Nast, Appl. Phys. Lett. 73, No 22, pp. 3214-6 (November 1998). It is envisioned that other texture-inducing methods can also be used in a similar way to generate the textured precursors.

The formation of textured films having a low number of grain boundaries, e.g., large crystalline grains, and a low defect density for use as a seed layer, has been previously described in an application by James Im, U.S. Ser. No. 10/994,205, filed Nov. 18, 2004, and entitled "System and Methods for Creating Crystallographic Controlled Orientation Controlled PolySilicon Films," the contents of which are incorporated herein in their entirety by reference. In that process, a film was pretreated to introduce a desired texture into the film and then crystallized using sequential lateral solidification (SLS) laser irradiation to form the enhanced grain growth that is typical of SLS. U.S. Pat. No. 6,322,625, entitled "Method and Tool for Generating Countersunk Holes in Composite Materials," as filed Nov. 18, 1981; U.S. Pat. No. 6,368,945, entitled "Method and System for Providing a Continuous Motion Sequential Lateral Solidification," as filed Mar. 16, 2000; U.S. Pat. No. 6,555,449, entitled "Methods for Producing Uniform Large-Grained and Grain Boundary Location Manipulated Polycrystalline Thin Film Semiconductors Using Sequential Lateral Solidification," as filed Sep. 3, 1999; U.S. Pat. No. 6,573,531, entitled "Systems and Methods Using Sequential Lateral Solidification for Producing Single or Polycrystalline Silicon Thin Films at Low Temperatures," as filed Sep. 3, 1999; and U.S. Provisional Patent Application No. 61/111,518, entitled "Flash Light Annealing for Thin Films," as filed on Nov. 5, 2008, issued to Dr. James Im, the entire disclosures of which are incorporated herein by reference, and which are assigned to the common assignee of the present application, describe such SLS systems and processes. In one or more embodiments, the process of pretreating the film is a mixed-phase solidification (MPS) process. This is a process that results in very low intragrain defect density in the crystalline structure.

Once the seed layer having the desired intragrain defect density and density of grain boundaries is provided, an amorphous or other low quality crystalline film is deposited on the seed layer (110 in FIG. 1). In this example, 110 refers to the label of the block in the flowchart of FIG. 1. The film is deposited using conventional methods, such as low pressure CVD, plasma enhanced CVD, physical deposition techniques such as sputter deposition, and the like.

The amorphous layer can be many times thicker than the seed layer and can be, for example, about 1 µm to about 20 µm thick or about 2-6 µm thick or as high as 10-20 µm thick. The amorphous layer can be as thick as desired in the final product, for example, a solar panel.

Although the high defect or top layer will typically be thicker than the seed layer, it doesn't need to be thicker, e.g., the seed layer can be very thick (~1 µm) and it can be processed in multiple steps to provide a low defect density film. For example, 1 µm of the defective silicon layer, i.e., top layer, can be deposited onto a seed layer followed by back side irradiation to induce epitaxy in the film.

The seed layer and top layer are supported on a substrate that is transparent to laser energy over at least a portion of its area. By "transparent to laser energy," it is meant that laser energy used in the treatment of the films described herein is not substantially absorbed by the substrate. Thus, laser energy is selectively absorbed by the film, with the concomitant heating and melting of at least a portion of the film. Irradiation from the back side of the substrate provides control over the extent of melting of the amorphous layer. Because the crystalline material of the seed layer melts at a higher temperature, it is possible to deposit enough energy to pass heat through the seed layer to induce melting of the defective layer without fully melting the seed layer.

Figure 2:
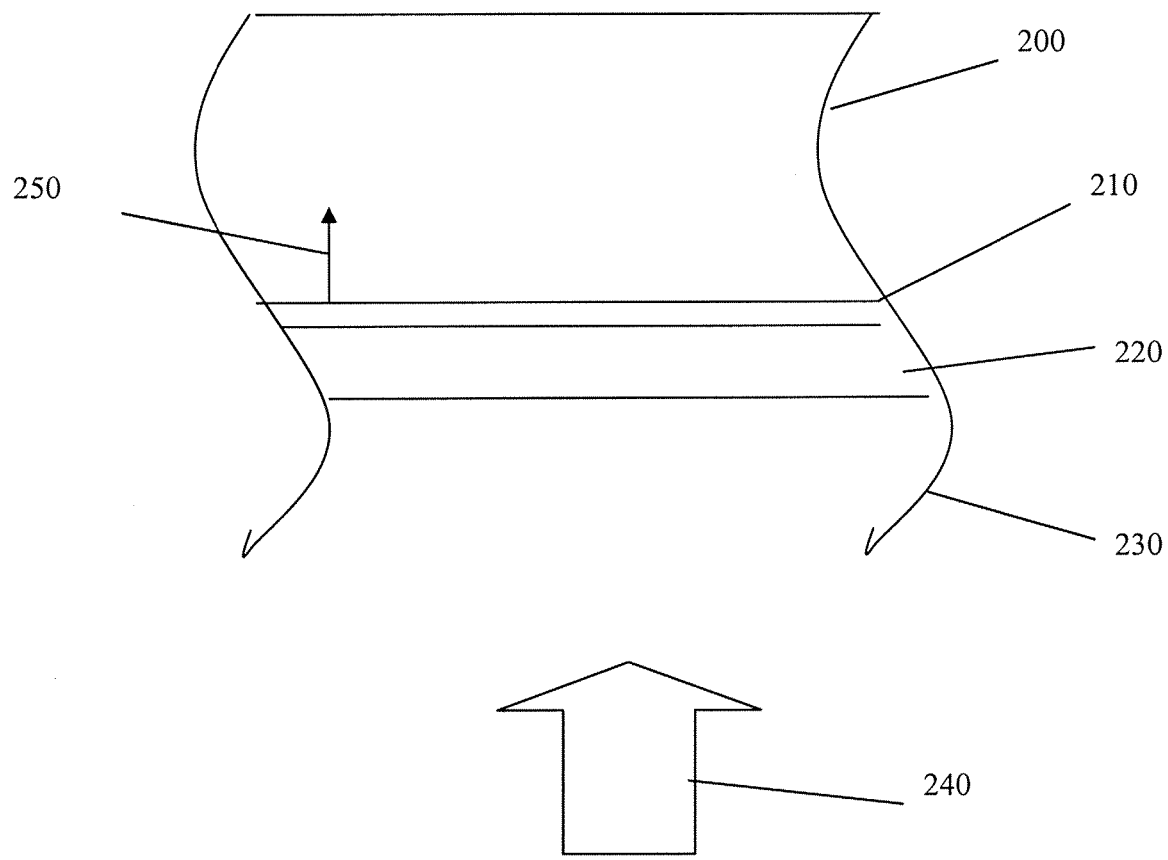
FIG. 2 is a schematic illustration of a back side irradiation process according to one or more embodiments described herein.

According to the embodiments disclosed herein, an initial region of the amorphous layer deposited above a crystalline seed layer is heated via radiation. The melting of the top layer is induced from the side of the a-Si that is in contact with the c-Si while the rest of the a-Si remains solid. As the seed layer is typically deposited or grown directly on the substrate, the irradiation typically occurs from the substrate side or back side of the film, as is shown in FIG. 2. Thus, as shown at 110 in FIG. 1, irradiation occurs from the back side of the substrate so that only the region closest to the irradiation source and adjacent to the seed layer is melted. While both the seed layer and the defective thick film are irradiated, the lower melting point for the defective layer causes it to melt first, or at least to start melting, before too much of the crystalline seed layer is molten (i.e., the seed layer is nearly completely molten so that it becomes discontinuous), or even before it is fully molten. The radiation may be absorbed by both layers, predominantly by the defective layer, or predominantly by the seed layer. The radiation may be absorbed (predominantly) in the c-Si film, so that the a-Si layer is heated to melting (predominantly) through conduction. As the first section of the amorphous layer melts and reforms as crystalline silicon, an exotherm is created by the energy being dissipated as heat from the silicon, as the silicon forms a more thermodynamically stable crystalline form. As the amorphous material melts in the presence of the crystalline material, but the temperature of the liquid is still below the melting point of the crystalline material, the crystallizing materials will grow epitaxially from the seed layer. That exotherm is sufficient to melt adjacent amorphous silicon which itself then re-crystallizes as crystalline silicon and releases an additional amount of energy. An exotherm, therefore, propagates as a wave through the material from the region closest to the substrate towards the upper surface.

Generally, the explosive crystallization process will continue until quenched or until all the amorphous material is transformed into crystalline material. Quenching is known to result in lowering of the temperature at the growth front and formation of defects and ultimately of halting of the process. Quenching is often the result of nearby conductive materials and/or nearby substrates. In the current configuration, however, significant quenching of the film is not to be expected because the fraction of the heat that is released at the growth front and that diffuses 'upwards' toward and into the remaining defective silicon is trapped therein. Also, the defective silicon typically has low thermal conductivity so that the heat does not quickly spread out over the film, but rather stays within the vicinity of the melting interface.

While the initial interface between the seed layer and the defective top layer may be rough, as, for example, with films obtained via MPS, the explosive crystallization process is expected to result in gradually smoothening of the melting and solidification interfaces. For those regions where the seed layer is protruding into the defective layer, the explosive crystallization front (i.e., the closely spaced melting and solidification fronts) will initially protrude into the defective layer as well and will therefore cool down more rapidly than elsewhere where the front may be planar or even curved negatively. As a result, the front is expected to slow down with respect to other regions and the overall front is expected to flatten/smoothen.

The laser source used to trigger the melting process can be any pulsed or chopped laser source that emits light to which the substrate is substantially transparent but absorbable by the film stack. For example, the laser may be a CW laser or an excimer laser. Additionally, light having a wavelength with an absorption depth on the order of or larger than the thickness of the precursor film may be used to promote heat absorption in the amorphous layer and reduce the heat absorbed in the seed layer. This can increase the process window in which a substantially continuous liquid film is created in the amorphous layer while a substantially continuous solid film remains in the crystalline precursor. Such wavelengths can be, for example, around 500 nm or longer as emitted by, for example, a frequency-doubled Nd:YVO$_4$ or Nd:YAG laser (532 nm), or even longer wavelengths. The laser energy and pulse duration are sufficient to melt a portion of the amorphous layer adjacent to the seed layer, in some embodiments, in a single laser pulse.

In one or more embodiments, the laser pulse melts a portion of the amorphous layer and induces explosive crystallization to transform a thick Si layer into a layer having crystalline properties in only a single laser pulse. The embodiments disclosed herein preferably use flood irradiation. Because of the beam used for flood irradiation, the edge region of the film can have a poorer quality as there will be lateral explosive crystallization there as well. The lateral part of the explosive front will quench more rapidly because of the two dimensional nature of the temperature profile. As such, there will be defect formation and defective growth. Upon overlapping with a second radiation pulse, this defective region, being already crystalline (albeit defectively), will not remelt. As such, a defective crystalline region with a short minority carrier lifetime will remain.

To alleviate some of these concerns, a flood irradiation beam with sharp edges and a substantially uniform energy density is used. Such a beam can be obtained using SLS equipment or line-beam ELA equipment. For those embodiments where the pulse is smaller than the area of the film, the defective regions can be positioned in areas where the film is later removed to create vias between the front contact of one cell and the back contact of the neighboring cell. The vias can be used to create cells in series. Some embodiments use flood irradiation with radiation areas as large as the panel (or a significant part thereof), for example, arrays of flash lamps or diode lasers. When the long wavelength is not sufficiently absorbed by the Si film, one can use metal layers under the seed layer and above the substrate, as discussed in more detail below. Further, these metal layers can be used to perform long wavelength flood irradiation from the top of the film.

In some embodiments, the film can melt completely upon backside radiation. Experimental work shows that for thin a-Si films (i.e., 200 nm on a 100 nm seed layer obtained via MPS), upon backside radiation, the a-Si was molten completely, while the seed layer remained at least partially intact. The texture reproduction was good with very little defect formation observed. A complete melting of the a-Si can be induced for a-Si films that are sufficiently thick for making a solar cell. This could be the case when longer wavelength radiation is used so that the absorption length exceeds the seed layer thickness. Also, pre-heating can cause complete melting. Furthermore, top side radiation of moderately absorbed light that is mostly absorbed by a metal layer located between the seed layer and the substrate (and discussed in more detail below) can cause complete melting.

As is discussed above, the amount of energy used to irradiate the film is less than that used in conventional melt-mediated epitaxy processes because only a thin region, and not the entire thick film, is melted. Therefore, a wider range of substrates can be used, including low temperature glasses and the like. For example, the methods disclosed herein can be used with, for example, glass substrates, but also with non-transparent substrates such as metal foils, such as stainless steel, or ceramic substrates.

In other embodiments, additional heat is added to sustain the process. Heating can be accomplished by substrate pre-heating or co-irradiation from the front side. Heat can be introduced to the top layer, for example, by irradiation, furnace pre-heating, a hot plate, or any other conventional source. Heating can reduce the amount of energy needed for irradiation and reduce the exposure of the substrate to damaging levels of heat. It can also be used to modify or control the rate of liquid from propagation through the amorphous top layer. For example, heating the film can reduce crystallization velocity.

FIG. 2 is a schematic illustration of the back side irradiation and crystallization according to one or more embodiments of the disclosed subject matter. The film (only a portion of which is shown in the figure) includes a substrate 230, on which is deposited a thin crystalline seed layer 220 and a thick amorphous silicon layer 200. Generally, back side irradiation is described with respect to thin films in a co-pending application, filed on even date herewith, entitled "Systems and Methods for Preparing Epitaxially Textured Polycrystalline Films," the entire disclosure of which is incorporated by reference. The method of back side irradiation of a thin film includes generating a textured precursor film and irradiating the film through the back side of the film, i.e., through the substrate to the film, to improve the texture throughout the film thickness. The back side irradiation can be SLS irradiation, which can simultaneously create uniform texture and microstructure. In some embodiments, the back side irradiation can be flood irradiation. If a non-SLS back side irradiation method is implemented, the required microstructure can be created by front side, i.e., through the top surface of the crystalline film, SLS irradiation after the back side irradiation has been performed. The principals of back side irradiation of thin films can be applied to the thin films disclosed herein. The a-Si layer 200 can be made by low pressure CVD. The film then is irradiated from the back side, as indicated by arrow 240, resulting in the formation of a small amount of liquid silicon 210 at the interface between seed layer 220 and amorphous silicon 200. The liquid phase 210 crystallizes and propagates in an explosive process in a direction through the amorphous silicon layer 200 along arrow 250.

This irradiation methodology has the additional benefit of trapping the heat in the film. As crystallization proceeds upwards in the film, the heat that is released upwards of the film gets trapped in a shrinking volume and thus temperature will rise. This temperature rise will result in a more gentle explosive crystallization taking place (e.g., crystallization velocity is decreased) and this will suppress the formation of defects. The crystallization velocity may be further reduced by introducing additional heat, e.g., from the top surface of the film, as noted previously.

Figure 3:
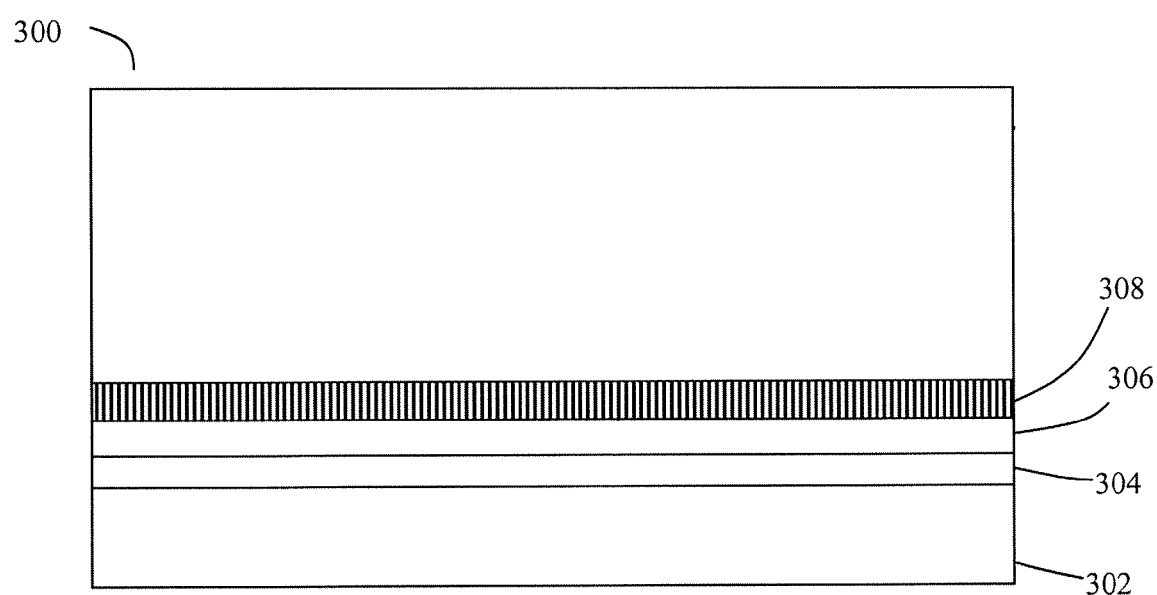
FIG. 3 is a cross section of a thick film with a metal film placed between the substrate and the seed layer according to one or more embodiments described herein.

In some embodiments, a thin metal film can be deposited under the silicon seed layer. FIG. 3 is a cross-sectional view of a thick film 300 including a substrate 302, a metal film 304, an optional buffer layer 306, the seed layer 308 and the thick top layer 310. The thin metal film can be composed of, for example, molybdenum. The buffer layer can be composed, for example, of silicon dioxide. In some embodiments, the metallic absorption occurs in a metal substrate, such as a metal foil. In some embodiments, no buffer layer is used and a metal layer is in direct contact with the a-Si film and can act as a backside contact in the solar cell stack.

In embodiments having the thin metal film layer, the silicon film can be irradiated from the top portion of the film, as shown in FIGS. 4a-c. In FIG. 4a, radiation 400 irradiates the top portion of the top layer 310 and penetrates through the thickness of the film to the metal layer. The radiation is of a type such that the silicon in the top layer 310 and the seed layer 308 absorbs only a portion of the incoming light, while the majority of the light is absorbed by the thin metal film, shown at 405. As shown in FIG. 4b, this absorption heats the metal thin film 304, thus providing heat to the silicon film from the bottom of the top layer adjacent to the seed layer and melting this portion of the top layer 410. As discussed earlier, the steps of heating and melting propagate throughout the top layer through explosive crystallization, as shown in FIG. 4c, where the previously melted layer 420 is crystallizing and heating a next portion of the top layer 420. Thus, this method provides similar heating to the silicon film as the back side radiation embodiment. The light source can be a laser, for example, a diode laser. For example, the diode laser can be an 808 nm laser.

While there have been shown and described examples of the disclosed subject matter, it will be readily apparent to those skilled in the art that various changes and modifications may be readily apparent to those skilled in the art that various changes and modifications may be made therein without departing from the scope of the disclosed subject matter as defined by the appended claims. Accordingly, the disclosed subject matter is limited only by the following claims and equivalents thereto.

What is claimed is:

1. A method for preparing a thick crystalline film, comprising:
   providing a film for crystallization on a substrate, wherein at least a portion of the substrate is substantially transparent to laser irradiation, said film comprising:
   (a) a seed layer having a predominant surface crystallographic orientation; and
   (b) a top layer disposed above the seed layer;
   heating the film from the top surface of the film;
   irradiating the film from the back side of the substrate using a pulsed laser to melt a first portion of the top layer at an interface with the seed layer while a second portion of the top layer remains solid; and
   re-solidifying the first portion of the top layer to form a crystalline layer epitaxial with the seed layer thereby releasing heat to melt an adjacent portion of the top layer.

2. The method of claim 1, wherein heating comprises co-irradiation from front side of film.

3. A method for preparing a thick crystalline film, comprising:
   providing a film for crystallization on a substrate, wherein at least a portion of the substrate is transparent to laser irradiation, said film comprising:
   (a) a seed layer having predominant surface crystallographic orientation;
   (b) a top layer disposed above the seed layer; and
   (c) a metal layer disposed below the seed layer;
   irradiating the film using a pulsed laser at a wavelength absorbable by the metal to heat the metal layer, said heat being transferred to the top layer to melt a first portion of the top layer at an interface with the seed layer while a second portion of the top layer remains solid; and
   re-solidifying the first portion of the top layer to form a crystalline layer epitaxial with the seed layer thereby releasing heat to melt an adjacent portion of the top layer.

4. The method of claim 3, wherein the step of irradiating is directed through the front side of the film.

5. The method of claim 4 where a portion of the light is absorbed by the film.

6. The method of claim 3, wherein the step of irradiating is directed through the back side of the film.

7. The method of claim 3, further comprising:
   providing a buffer layer between the seed layer and the metal film.

* * * * *